US006671230B1

(12) United States Patent
Benjamin

(10) Patent No.: US 6,671,230 B1
(45) Date of Patent: Dec. 30, 2003

(54) PIEZOELECTRIC VOLUMETRIC ARRAY

(75) Inventor: Kim C. Benjamin, Portsmouth, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/171,568

(22) Filed: Jun. 10, 2002

(51) Int. Cl.[7] ........................ H04R 17/00; H01L 41/083

(52) U.S. Cl. ........................ 367/155; 310/334; 310/337

(58) Field of Search ................................ 310/334, 336, 310/337, 366; 367/155, 164

(56) References Cited

U.S. PATENT DOCUMENTS 3,979,711 A * 9/1976 Maginness et al. ......... 367/155
5,548,564 A * 8/1996 Smith ......................... 367/155
5,744,898 A * 4/1998 Smith et al. ................ 310/334
6,225,728 B1 * 5/2001 Gururaja ..................... 310/334
6,437,487 B1 * 8/2002 Mohr et al. ................. 310/366

* cited by examiner

*Primary Examiner*—Ian J. Lobo
(74) *Attorney, Agent, or Firm*—James N. Kasischke; Michael F. Oglo; Jean-Paul A. Nasser

(57) ABSTRACT

A three-dimensional array of acoustic sensors. The array can be used for both the transmission and reception of acoustic signals. The array comprises electroplated piezoelectric polymer layers that are laminated with a non-conductive epoxy to form individual multi-layer array transducer elements. Circuit support layer layers are incorporated between the multi-layer array transducer elements. Because of the three-dimensional configuration of the array, logical transducers can be created from multiple transducer elements, and transmission and reception of acoustic signals in any direction can be realized.

19 Claims, 9 Drawing Sheets

PIEZOELECTRIC VOLUMETRIC ARRAY

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

Not applicable.

BACKGROUND OF THE INVENTION (1) Field Of The Invention

The present invention generally relates to a sonar array, and more particularly to a three dimensional array of sonar sensors.

(2) Description of the Prior Art

Arrayed transducers are known in the art. Specifically, Hill et al., U.S. Pat. No. 4,380,808, describes a sparse or "thinned"array of mass loaded PZT elements. Hill et al. further describes a particular uniform element placement scheme that is utilized to achieve three half-wave element spacings for three separate operating frequencies. Francis, U.S. Pat. No. 4,638,468, describes a polymer hydrophone array with printed circuit wiring. Ehrlich et al., U.S. Pat. No. 4,766,575, describes a cylindrical sonar array that employs rectangular planar array segments that extend in the axial direction when assembled on a cylindrical conducting plate having flat longitudinal portions to which the planar array segments are attached. Each planar array segment comprises two columns of planar transducer elements with each column extending in the axial direction of the cylinder. Peloquin, U.S. Pat. No. 5,550,791 describes a composite hydrophone array assembly that is made from a compliant mandrel such as a hollow tube and at least one wrap of piezoelectric film adhered to the compliant hollow tube at a plurality of locations thereon. Lindberg, U.S. Pat. No. 5,530,683, describes an acoustic transducer that is constructed as a stacked configuration of multi-layer transducer elements. Each layer within the transducer contains elements in (along) one-dimension. Furthermore, the transducer elements are limited to high-frequency operation.

What is needed is a sonar array system that provides a relatively greater spatial operational capability than the prior art, and provides single or double resonance frequency elements.

SUMMARY OF THE INVENTION

The present invention is directed to a three-dimensional array of acoustic sensors for underwater imaging applications. The array utilizes electroplated layers of piezoelectric polymer (PVDF), or any other electrostrictive polymer, in conjunction with interleaved circuit support layers to providing a volumetric three-dimensional array whereby individual transducer elements may be formed between parallel circuit support layer layers. The three-dimensional configuration of transducers allows formation of acoustic beams in any direction. The individual transducer elements can be grouped into logical transducers operating in a different frequency band. The array can be used for both transmitting and receiving.

The sonar array of the present invention has many applications, e.g., smart acoustic countermeasure devices and unmanned underwater vehicle SONAR systems. The three-dimensional array elements provide a SONAR user with a relatively increased operational field of view as compared to prior art two-dimensional arrays.

A feature of the array of present invention is the use of piezoelectric or electrostrictive polymers (i.e. PVDF) as an active transduction material. An advantage of this feature is that the specific acoustic impedance of piezoelectric polymer is very closely matched to that of water. When the acoustic impedance of the array elements of the volumetric array of the present invention are closely matched to the surrounding fluid (e.g., ocean water), transmission and reception of very wide-band acoustic signals can be realized.

Another important feature of the present invention is that the array can be configured to have a planar or cylindrical geometry.

In one aspect, the present invention is directed to a sonar array comprising a transducer element having a plurality of layers of acoustically transparent electro-acoustic transducer material in a laminated configuration. Each of the layers has a first side with a plurality of electrically conductive portions that are (i) electrically isolated from each other, (ii) arranged in a two-dimensional arrangement, and (iii) configured to have a first polarization. The second side has a plurality of electrically conductive portions that are (i) electrically isolated from each other and the conductive portions on the first side, (ii) arranged in a two-dimensional arrangement that is the same as the two-dimensional arrangement in which the conductive portions of the first side are arranged such that the conductive portions of the second side are substantially aligned with the conductive portions of the first side, and (iii) configured to have a second polarization opposite the first polarization. The layers are arranged so that opposite polarizations do not confront each other. The end layers of the laminated configuration have exposed sides which have different polarities. The electrically conductive first side portions corresponding to the same location within the two-dimensional arrangement are electrically connected together and the electrically conductive second side portions that correspond to the same location within the two-dimensional arrangement are also electrically connected together.

The sonar array can also have a pair of circuit support layers attached to a corresponding exposed side. Each of the circuit support layers has a plurality of electrically conductive regions that are electrically isolated from each other. Each of the regions is electrically connected to a corresponding electrically conductive portion of the exposed side. A plurality of electrically conductive terminal members are attached to each circuit support layer and electrically connected to a corresponding region.

In a preferred embodiment, the acoustically transparent electro-acoustic transducer material is selected from the group consisting of urethane, electrostrictive polyurethane, polyvinylidene fluoride, and polyvinylidene trifluoroethylene.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT

In describing the preferred embodiments of the present invention, reference will be made herein to FIGS. 1–8 of the drawings in which like numerals refer to like features of the invention.

Figure 1:
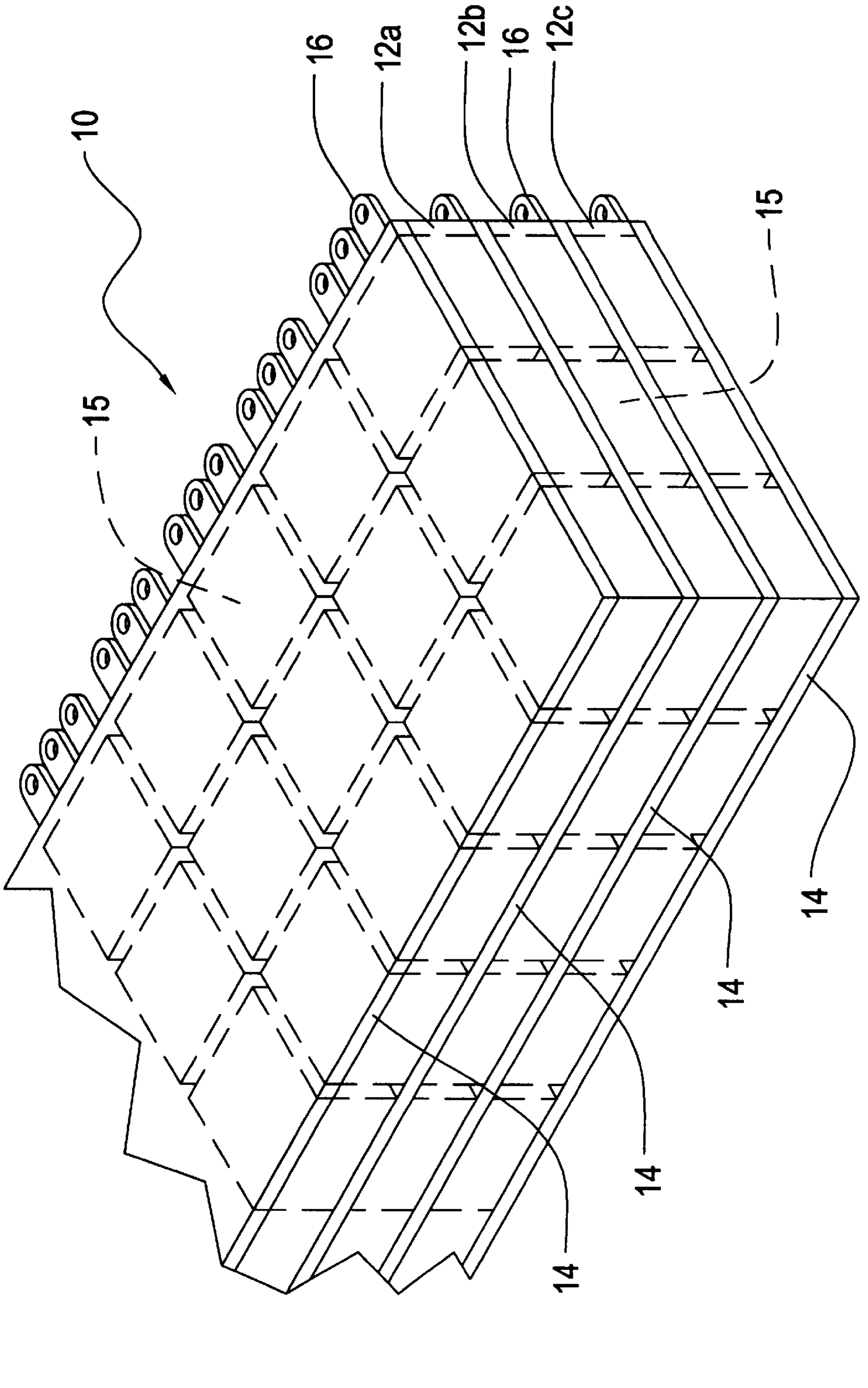
FIG. 1 is a perspective view of a completed laminate volumetric array assembly made in accordance with one embodiment of the present invention.

Referring to FIG. 1, there is shown the completed volumetric sonar array 10 fabricated in accordance with one embodiment of the invention. Sonar array 10 generally comprises transducer layers 12*a*, 12*b* and 12*c*, and circuit support layers 14. Circuit support layers 14 are bonded to the transducer layers 12*a*, 12*b* and 12*c* to form the completed array 10. Transducer layers 12 form a two dimensional array of individual transducers 15. Each of these transducers has an operating frequency band determined by the Nyquist criteria; however, it is understood that one could group a plurality of these transducers in a three dimensional region to form a logical transducer having a lower operating frequency band. Each circuit support layer 14 includes terminals 16 that are configured to be electrically connected to wires or conductors (not shown) to enable transfer of signals to and from transducers 15 in array 10. Thus, other sonar components and systems can receive or transmit signals from or to, respectively, array assembly 10. The three-dimensional configuration of transducers elements 15 allows formation of acoustic beams in any direction. Array 10 can be used for both transmitting and receiving. The construction of array 10 is discussed in detail in the ensuing description.

Figure 2A:
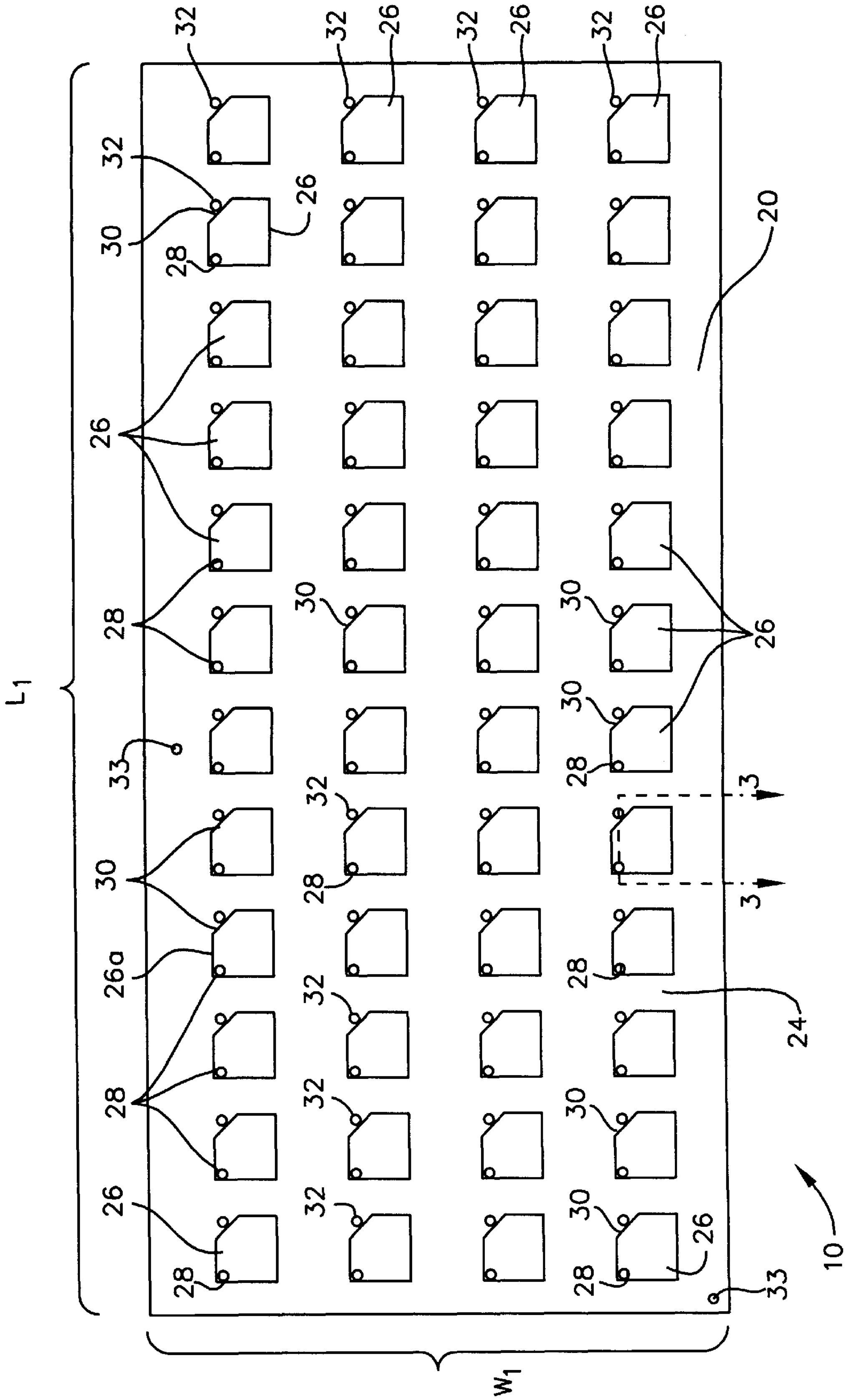
FIG. 2A is a plan view of one side of piezoelectric polymer layer used in the array of the present invention.
Figure 2B:
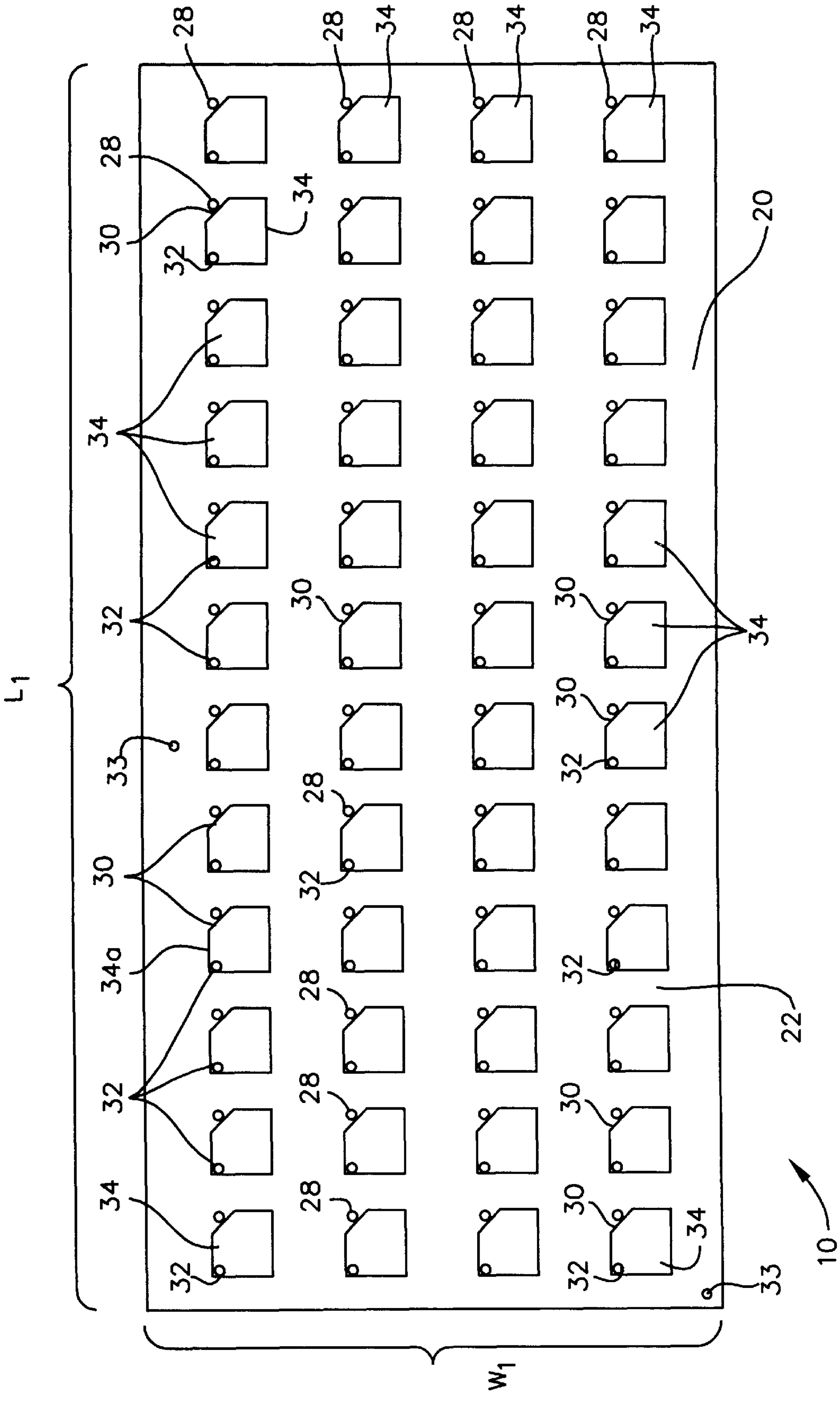
FIG. 2B is a plan view of the opposite side of the piezoelectric polymer layer of FIG. 1.
Figure 3:
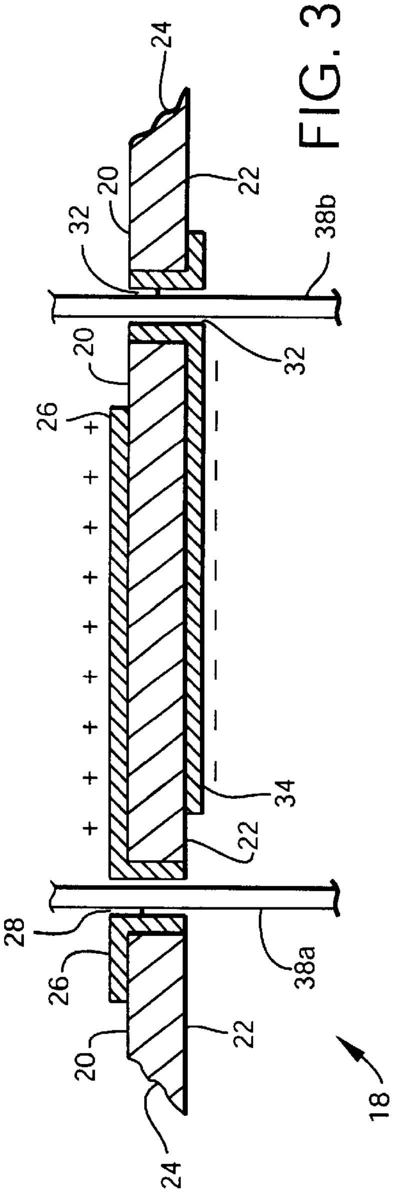
FIG. 3 is a cross-sectional view taken along line 3—3 in FIG. 2A.

Referring to FIGS. 2A, 2B and 3, there is shown a portion of one transducer layer 12 having a piezoelectric layer 18 made from a piezoelectric polymer (such as polyvinylidene fluoride (PVDF) or the like). Layer 18 comprises side 20 and side 22. Sides 20 and 22 are substantially the same in construction. Either side 20 or 22 can be designated as the positive-polarity side or negative polarity side. For purposes of explaining the present invention, sides 20 and 22 are designated as the positive and negative polarity sides, respectively. It is to be understood that other suitable materials that can achieve the same results also can be used to fabricated piezoelectric layer 18. Such materials include electrostrictive polyurethanes, and polyvinylidene difluoroethylene and polyvinylidene trifluoroethylene.

Side 20 comprises an electrically non-conductive portion 24 and electrically conductive portions 26 that are formed by electro-depositing adhesive films (or any other technique known in the art) onto layer 24. Conductive portions or electrodes 26 are spaced apart and electrically isolated from one another. In a preferred embodiment, conductive portions 26 have the same geometrical shape. In one embodiment, each conductive portion 26 has a generally rectangular shape, includes a first plated through-hole 28 in the upper left hand corner thereof. Thus, each plated through-hole 28 is in electrical contact with conductive portion 26 associated with that plated through-hole 28. A portion of each conductive portion 26 is notched or cut away, as indicated by numeral 30. A second plated through-hole 32 is located in the notched portion 30 of conductive portion 26. Second plated through-holes 32 are electrically isolated from the conductive portions 26. In a preferred embodiment, plated through-holes 28 and 32 are configured as copper-plated through-holes. In one embodiment, a photo-etched pattern is used to effect electrical isolation of the second through-holes 32. In another embodiment, second through-holes 32 are positioned in the non-conductive portion near an associated conductive portion 26.

Side 22 (FIG. 2B) comprises electrically non-conductive portion 24 and electrically conductive portions or electrodes 34. Conductive portions 34 are equidistant and electrically isolated from one another. In a preferred embodiment, conductive portions 34 have the same geometrical shape. In one embodiment, each conductive portion 34 has a generally rectangular shape. Each conductive portion, 34 includes a corresponding second plated through-hole 32 in electrical contact with the corresponding conductive portion 34. A portion of each conductive portion 34 is notched or cut away, as indicated by numeral 36 so as to provide space for first plated through-hole 28. As above, other embodiments can feature different arrangements for avoiding conduction between conductive portion 34 and first through-hole 28.

Thus, each conductive portion 26 is located directly opposite, but is electrically isolated from, a corresponding conductive portion 34. In a preferred embodiment, conductive portions 26 and 34 are arranged in a row-column (i.e. two-dimensional) arrangement as shown in FIGS. 1 and 2A. Thus, each conductive portion 26 and 34 may be referred to by its row-column location. For example, conductive portion 26*a* is located at row-column location (1, 4). Similarly, conductive portion 34*a* is located a row column location (2, 2). Although FIGS. 1 and 2A show twelve columns and three rows, it is to be understood that the actual number of conductive portions 26 and 34 required depends upon the particular application for which the volumetric array of the present invention is to be used. In one embodiment, electrically non-conductive portion 24 is fabricated from piezoelectric plastic. Conductive portions 26 can be formed by metallic layers that are electroplated or electro deposited on layer 24. In one embodiment, layer 18 has a length $L_1$ of about four feet, a width $W_1$ of about eighteen inches, and an overall thickness of about 0.20 inch. However, layer 18 may be configured to have other dimensions depending upon the required number of conductive portions 26 and the particular application for which the volumetric array of the present invention is to be used. Layer 18 further includes fiducial marks 33 located on sides 20 and 22.

Figure 4:
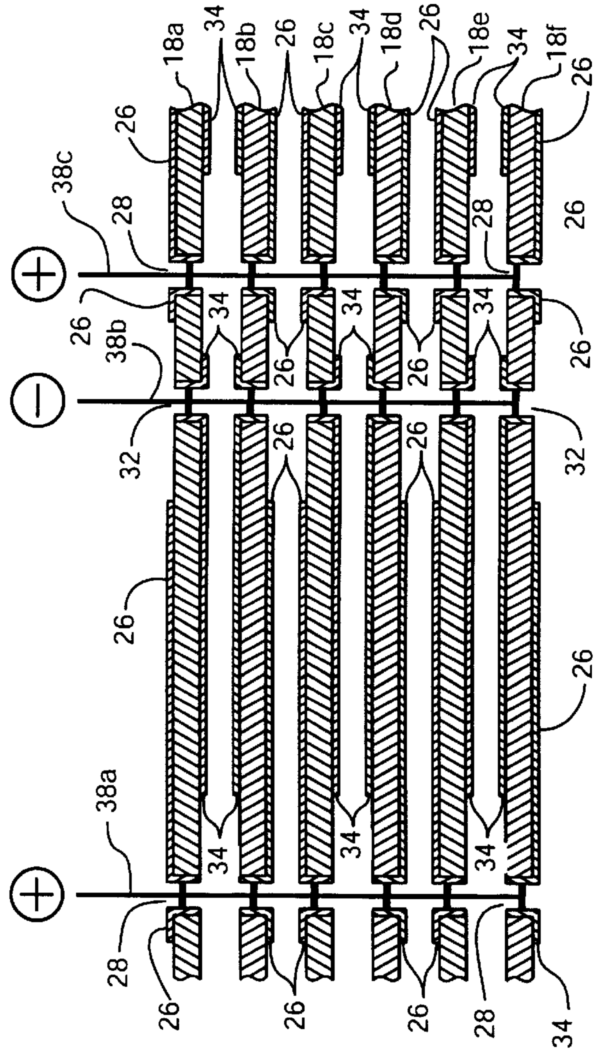
FIG. 4 is an exploded view illustrating a laminate assembly of the piezoelectric polymer layers of FIG. 2A and 2B which form a laminate array element of the sonar array of the present invention.
Figure 5:
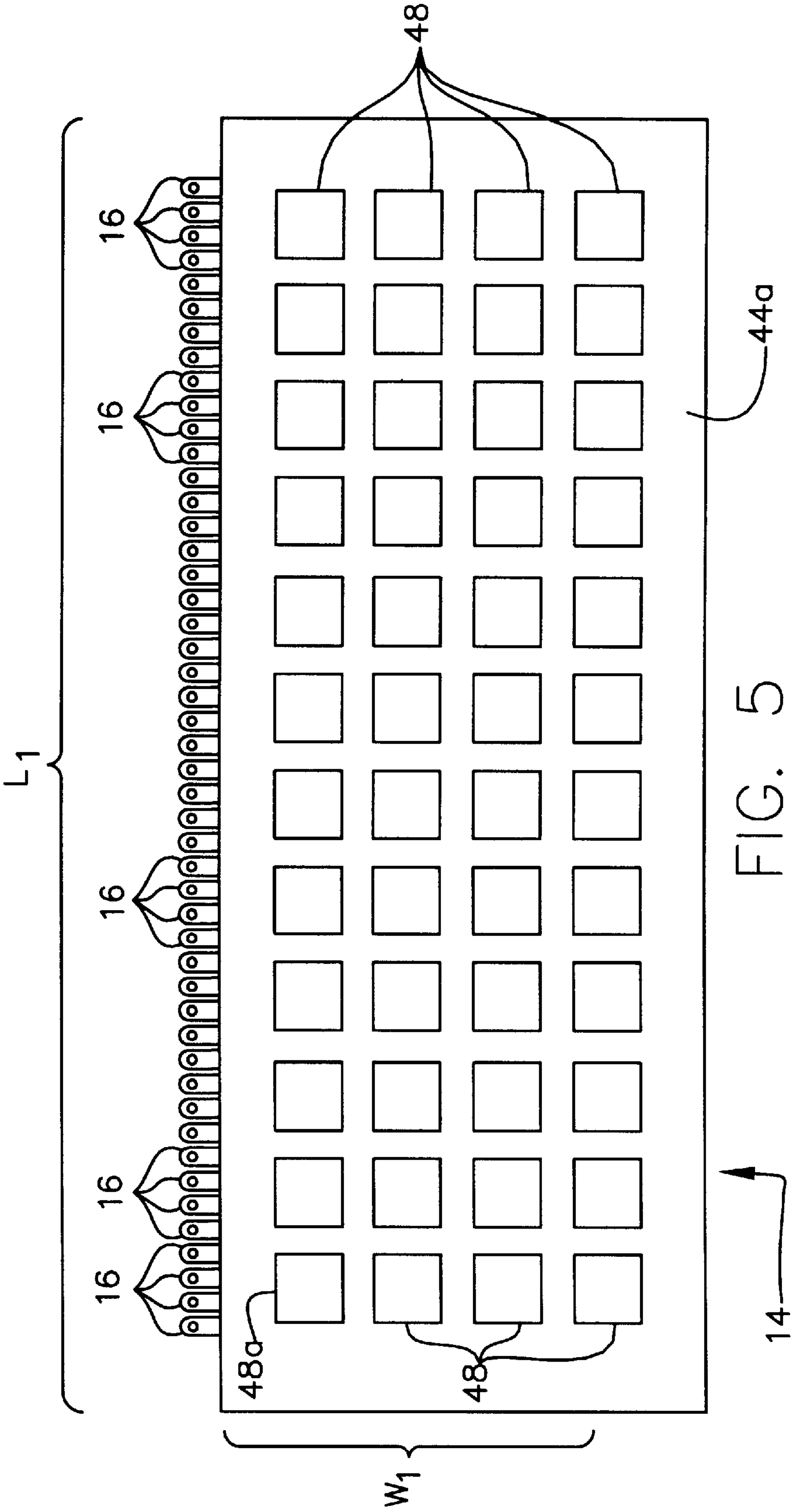
FIG. 5 is a plan view of one side of a circuit support layer used in the array of the present invention.
Figure 6A:
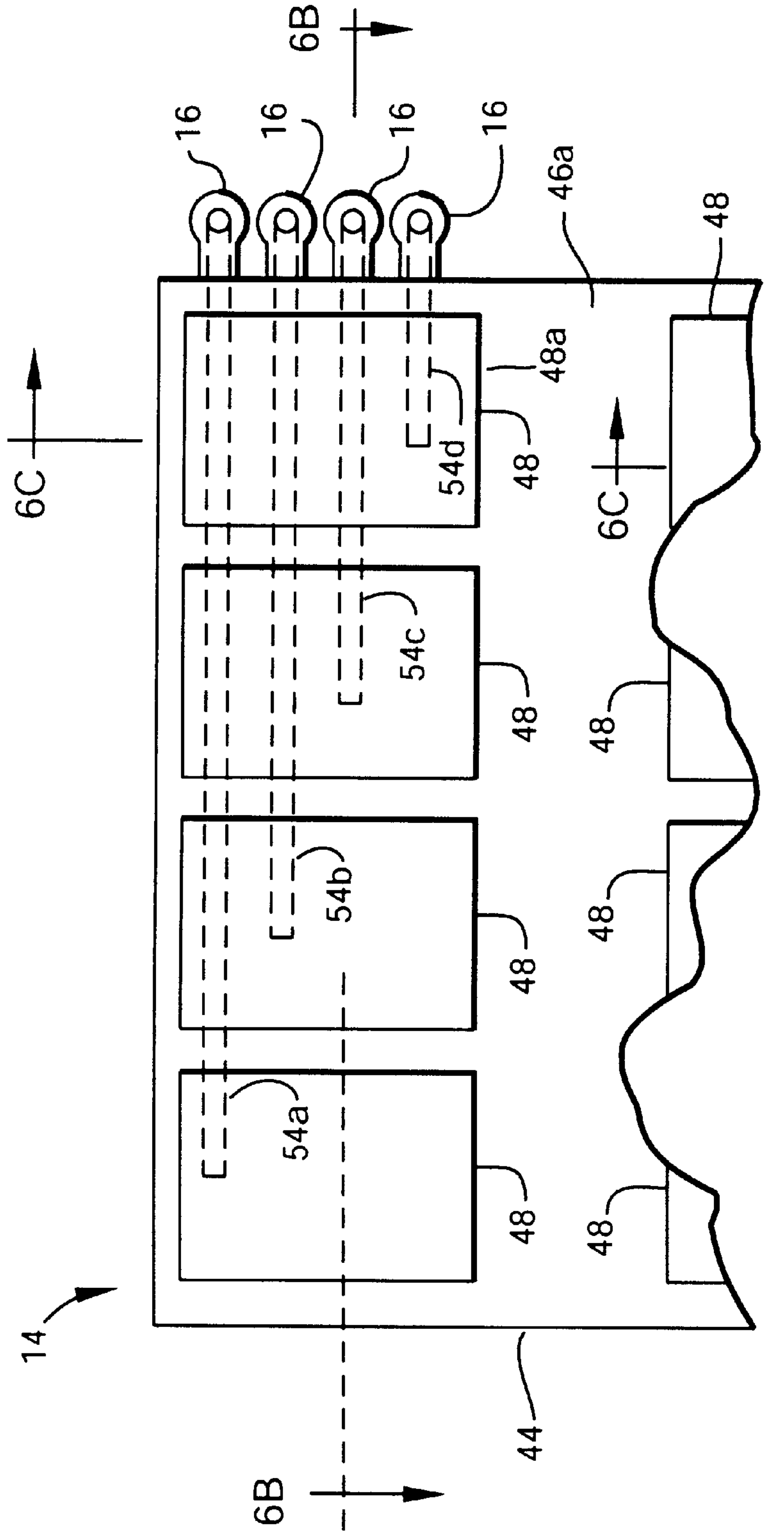
FIG. 6A is a enlarged, partial plan view of the side of the circuit support layer shown in FIG. 3.
Figure 6B:
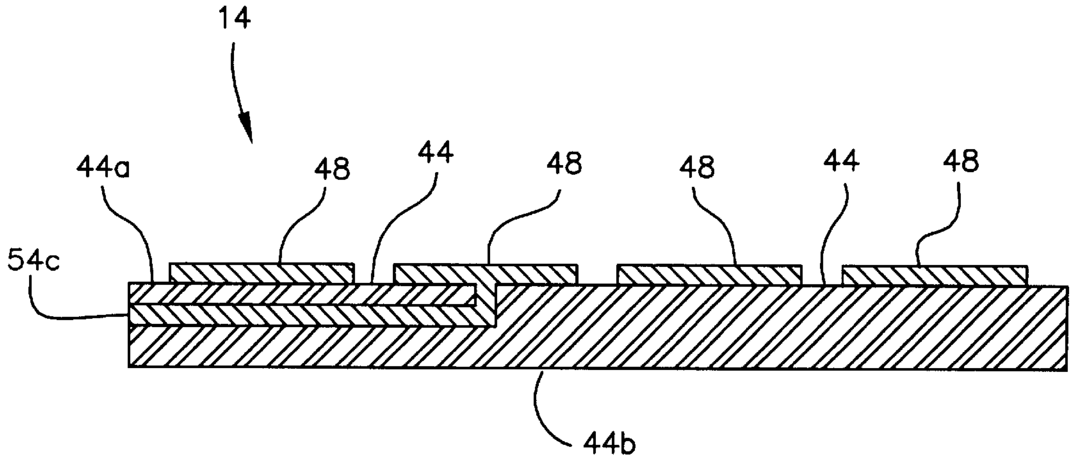
FIG. 6B is a cross-sectional view taken along line 4B—4B in FIG. 4A.
Figure 6C:
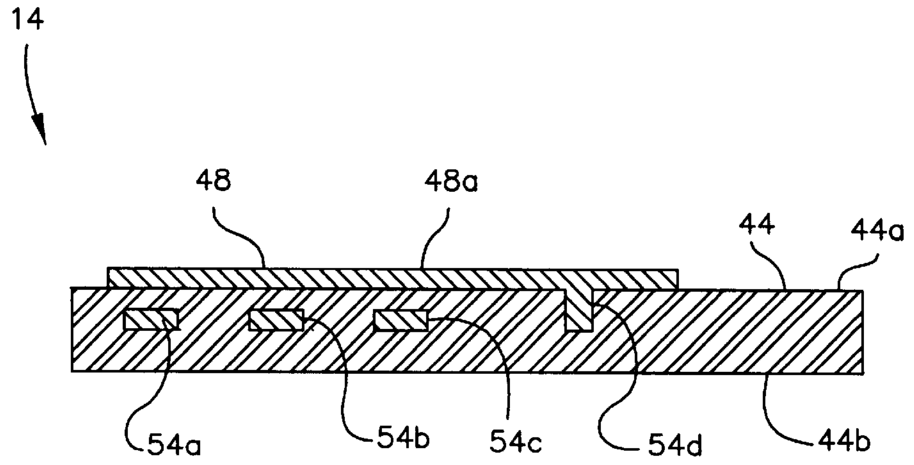
FIG. 6C is a cross-sectional taken along line 4C—4C in FIG. 4A.

Referring to FIG. 4, a plurality of layers 18, designated by 18*a*, 18*b*, 18*c*, 18*d*, 18*e*, and 18*f*, are joined together to form a multi-layer transducer 15. The view shown in FIG. 4 is a partial, exploded view, in cross-section, of one transducer layer 12. In a preferred embodiment, a z-axis conductive film 40 is positioned between layers 18*a*, 18*b*, 18*c*, 18*d*, 18*e*, and 18*f* to bond the layers together. Film 40 serves two purposes: bonding layers together and allowing conduction in vertical direction between layers. This allows conduction between conductive portions 26 as shown by 38*a* while preventing conduction between conductive portions 26 and conductive portions 34 having an opposite polarity. Other embodiments of this invention can feature other structures known in the art which provide these functions separately or in combination. Layers 18 are arranged such that the positive polarity sides of layers 18*b–f* face the positive polarity side of the adjacent layer and the negative polarity sides of layers 18*b–f* face the negative polarity side of adjacent layers 18. Thus, electrodes having opposite polarizations never confront each other. Lines 48*a* show the electrical connection of the positive (+) polarity conductive portions 26. Lines, 38*b* show the electrical connection between the negative (–) polarity conductive portions 34. Line 38*c* shows the connection formed among the positive polarity conductive portions 26 of a different transducer 15. Layers 18 are bonded together such that the rows and columns of conductive portions 26 and 34 of the layers 18 are substantially aligned. Although six layers 18 are shown in FIG. 4, it is to be understood that this is merely exemplary and that the actual number of layers 18 and conductive portions 26 and 34, depend upon the actual application (i.e., frequency band) for which the array of the present invention is to be used. Furthermore, the element aperture will also vary according to the frequencies of operation. For example, for relatively high frequencies, the number of layers 18 utilized can be five or six with element apertures on the order of about 0.39 inch. Lines 38*a*, 38*b* and 38*c* provide conductive joining.

Referring to FIGS. 2A and 4, each conductive portion 26 of each layer 18*a–f* that corresponds to the same row-column location is electrically connected together via a conductive connector, such as a line 38*a* shown in FIG. 2A. Preferably, line 38*a* is a conductive path provided by a well known z-axis conductive film; however other techniques well known in the art can be used to provide this conductive path. Referring to FIGS. 2B and 4, each conductive portion 34 of each layer 18*a–f* that corresponds to the same row-column location is electrically connected together via the conductive path 38*b* shown in FIG. 2A. Preferably, line 38*b* is a z-axis conductive film as discussed above.

Referring to FIGS. 5, and 6A–C, there is shown circuit support layer 14 used in the array of the present invention. Circuit support layer 14 is a single-sided circuit and comprises electrically non-conductive layers 44. Layer 44 has side 44*a* and 44*b*. In one embodiment, layers 44 are fabricated from Kapton™. Circuit support layer 14 further includes conductive portions 48 which are electrically isolated from one another. Each conductive portion 48 is positioned so that it is substantially aligned with a particular row-column location on an element 26 on the piezoelectric polymer layer 18. Circuit support layer 14 further includes terminal portions 16 which are attached to or formed on the periphery of circuit support layer 14. An arbitrary number of conductive terminals 16 allow wires to be attached to the circuit support layer which connects to the conductive portions 26 that are in each column (see FIG. 1). Circuit support layer 14 further includes conductive traces 54. Each conductive trace 54 is between layers 44 and extends from a particular terminal portion 16 to a particular conductive portion 48. Side 44*b* has no electrically conductive material thereon. Preferably, layers 44 are configured from a material that enables the portions of layers 44 having no conductive trace 54 therebetween to bond to each other. Since circuit support layer 14 is a single-sided flex circuit, side 44*b* does not have any conductive portions thereon. In a preferred embodiment, circuit support layers 14 are used as the outer most layers of the array wherein side 44*b* is the exposed side. Circuit support layer 14 is just one example of a suitable single-sided circuit support layer that can be used in the sonar array of the present invention. Other suitable single sided circuit support layer configurations can used as well. In order to utilize single-sided circuit support layer 14 in the array's interior wherein conductive portions of the piezoelectric polymer layers 18 (i.e. conductive portions 26 or 34) are on both sides of circuit support layer 14, two circuit support layers 14 are bonded together using a non-conductive adhesive film so as to function as a double-sided circuit support layer. In another embodiment, double sided-circuit support layers can be used in the interior of the array. In an alternate embodiment, stiffening plates (not shown) are attached to circuit support layers 14 to provide structural rigidity.

Figure 7:
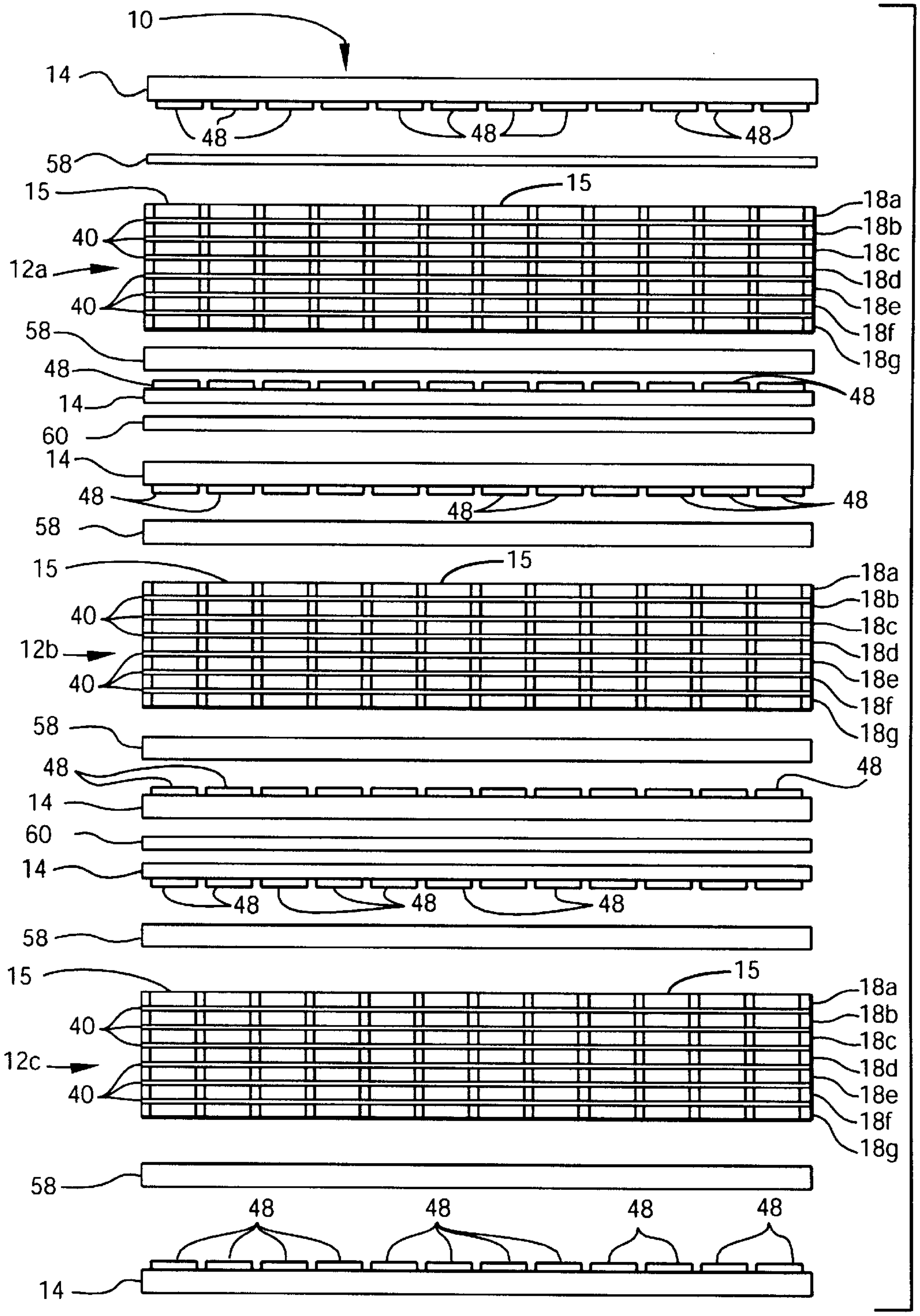
FIG. 7 is an exploded view illustrating a laminate array assembly comprising a plurality of the laminate array elements of FIG. 4 and a plurality of circuit support layers of FIG. 5 that, when completely assembled, form one embodiment of the volumetric array of the present invention.

Referring to FIG. 7, a plurality of laminate transducer layers 12 and circuit support layers 14 are joined together to form a laminate array assembly 10. It should be understood that FIG. 7 is not to scale, and the layers may be much thinner than those shown in this figure. An adhesive film 58 is used to bond circuit support layers 14 to layers 12. In one embodiment, adhesive film 58 is configured as the commercially available Z-axis adhesive film which conducts electrical current in the direction perpendicular to the surface of the film. Other types of suitable adhesives may be used as well, such as B-stage adhesive films. For purposes of identification and to facilitate understanding of the present invention, the designations 12*a*, 12*b*, 12*c* and 12*d* refer to particular transducer layers 12 that are part of array assembly 10, while the designations 18*a*, 18*b*, 18*c*, 18*d*, 18*e*, 18*f* and 18*g* refer to particular ones of layers 18 that are part of each transducer layer 12. The individual transducers 15 are the combined columns of transducer material layers 18 positioned on a transducer layer 12. Circuit support layers 14 are used as the outermost layers of assembly 10. Circuit support layers 14 are also used in the interior of assembly 10. As described above, two circuit support layers 14 are bonded together to form a double-sided circuit support layer. A non-conductive adhesive film 60 is used to bond the two single-sided circuit support layers 14 together. Adhesive film 58 is disposed over layer 18*a* of transducer layer 12*a* and bonds circuit support layer 14 to layer 18*a*. When circuit support layer 14 is bonded to layer 18*a*, the conductive portions 48 are electrically connected to the exposed corresponding conductive portions (i.e. portions 26 or 34) of layer 18*a*. Similarly, adhesive film 58 bonds the other circuit support layer 14 to layer 18*g* of transducer layer 12*c*. When the circuit support layer 14 is bonded to layer 18*g*, the conductive portions 48 are electrically connected to the exposed corresponding conductive portions (i.e., portions 26 or 34) of layer 18*g*.

All positive polarity conductive portions 26 of layers 18*a*–18*g* of transducer layer 12*a* that correspond to a particular row-column location are electrically connected together and to the conductive portion 48 of the top circuit support layer 14 that has the same row-column location. Similarly, all negative polarity conductive portions 34 of layers 18*a*–18*g* of transducer layer 12*a* that correspond to a particular transducer layer 12 and column location are electrically connected together and to the conductive portion 48 of the bottom circuit support layer 14 that corresponds to that same particular row-column location. Together, the positive and negative portions of a single row-column location form individual transducer 15. Columns of layers 18*a*–18*g* on layers 12*b* and 12*c* are joined together in a similar manner to form a plurality of transducers 15 in a three dimensional array.

Figure 8:
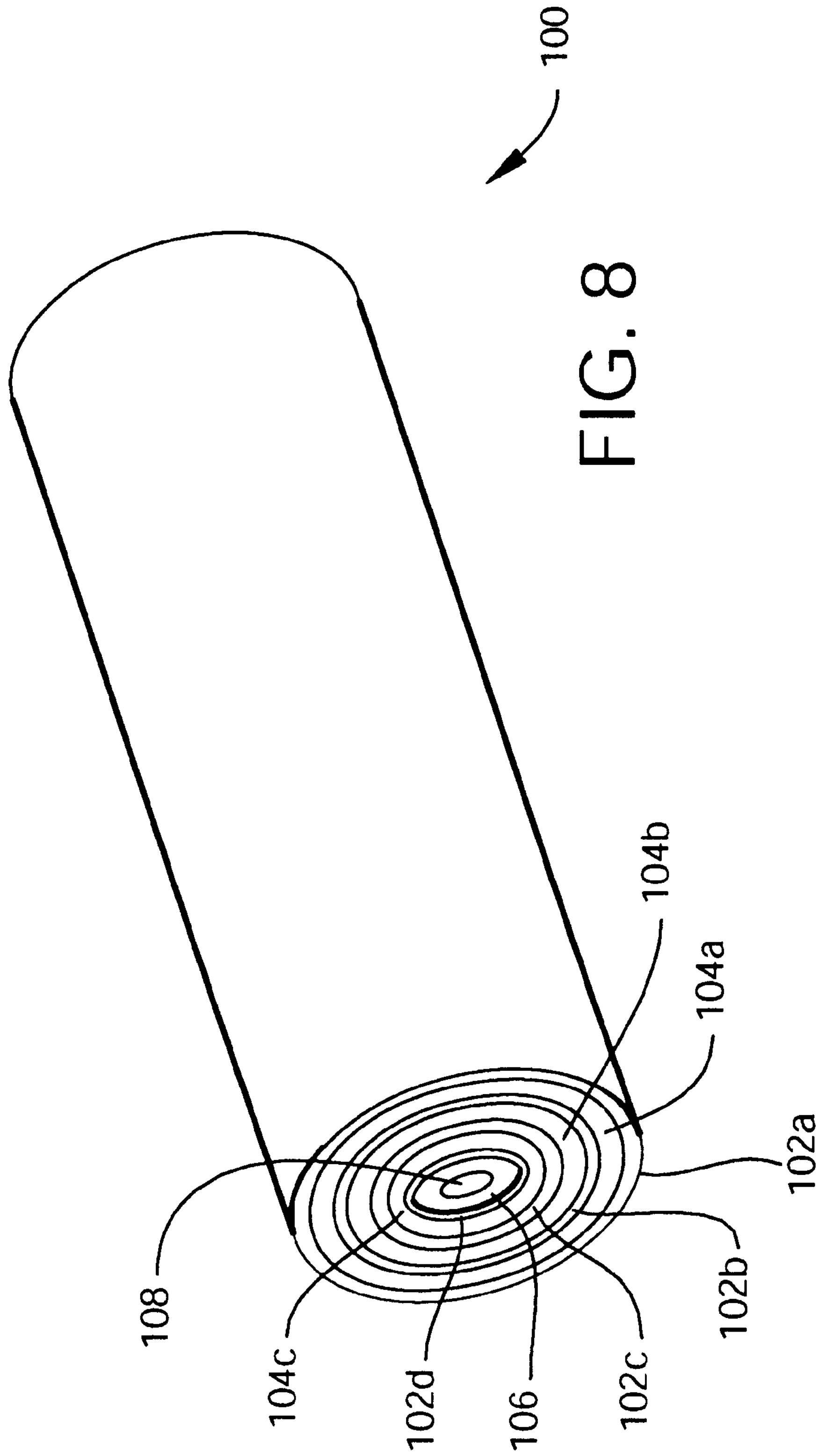
FIG. 8 is a perspective view of a volumetric array in accordance with another embodiment of the present invention.

Array assembly 10 has a generally planar geometry. However, other geometrical shapes are possible. For example, FIG. 8 shows a sonar array 100 of the present invention which has a generally cylindrical shape. Array 100 generally comprises circuit support layers 102*a*, 102*b*, 102*c* and 102*d*, and multi-layer array transducer elements 104*a*, 104*b* and 104*c* that are rolled about backing member 106 to provide the cylindrical shape. Circuit support layers 102*a* and 102*d* are configured as single sided circuit support layers and form the outermost and innermost layers, respectively, of assembly 100. Circuit support layers 102*b* and 102*c* are double-sided circuit support layers. Adhesive layers, not shown but similar to adhesive layers 58, bond the circuit support layers to the array transducer elements. Each transducer layer 104*a*, 104*b* and 104*c* is generally the same in construction as transducer layer 12. However, the precise location or placement of the conductive portions of the layers of particular layers 104*a–c* as well as the conductive portions of particular circuit support layers 102*a–d* are shifted to account for the overall thickness of array 100 as the aforesaid circuit support layers and transducer elements are rolled about backing member 106. Electronics cavity 108 is located in the center of backing member 106. In a preferred embodiment, the aforementioned components are wound in a scroll-like fashion in order to achieve the cylindrical shape of array 100.

In accordance with one aspect of the invention, the components described in the foregoing description are arranged so as to provide a volumetric or three-dimensional sonar array. The three-dimensional array elements of the array of the present invention provide a relatively greater spatial operational capability. The utilization of plastic components such as the piezoelectric polymer layers, the thin Kapton™ copper circuit support layers and then the thin adhesive layers provide the individual array layers 12*a*, 12*b* and 12*c* with very wide operational bandwidths, and acoustic transparency needed to form a volumetric array.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A volumetric transducer array comprising:

at least one layer of transducer elements having a plurality of transducer columns, a first exposed surface and a second exposed surface, each said transducer column extending from said first exposed surface to said second exposed surface and having a first contact surface on said first exposed surface and a second contact surface on said second exposed surface, said layer of transducer elements comprising at least one acoustically transparent transducer material layer having a first side and a second side opposite said first side, a plurality of first side electrically conductive portions mounted on said first side of each said acoustically transparent transducer material layer such that each first side electrically conductive portion is electrically isolated from other first side electrically conductive portions, and said first side electrically conductive portions having a first polarity, said acoustically transparent transducer material layer further including a plurality of second side electrically conductive portions mounted on said second side of each acoustically transparent transducer material layer such that each second side electrically conductive portion is substantially aligned with a corresponding one of said first side electrically conductive portions, each second side being electrically isolated from other second side electrically conductive portions, and said second side electrically conductive portions having a second polarity opposite said first polarity;

at least one pair of circuit support layers, one circuit support layer positioned on said transducer element first exposed surface and being in electrical contact with said first contact surface of each said transducer column and the other circuit support layer positioned on said transducer element second exposed surface and being in electrical contact with said second contact surface of each said transducer column;

said plurality of first side electrically conductive portions being arranged on said layer of acoustically transparent transducer material such that each shares a two-dimensional position with corresponding first side electrically conductive portions on other acoustically transparent transducer material layers, all of said first side electrically conductive portions at a corresponding position being electrically joined together and joined to one of said pair of circuit support layers; and said plurality of second side electrically conductive portions being arranged on said layers of acoustically transparent transducer material such that each shares a two-dimensional position with corresponding second side electrically conductive portions on other acoustically transparent transducer material layers, all of said second side electrically conductive portions at a corresponding position being electrically joined together and joined to another of said pair of circuit support layers.

2. The volumetric transducer array according to claim 1 wherein said layer of transducer elements and circuit support layers are configured to provide said volumetric transducer array with a generally planar geometry.

3. The volumetric transducer array according to claim 1 wherein said layer of transducer elements and circuit support layers are configured to provide said volumetric transducer array with a generally cylindrical geometry.

4. The volumetric transducer array according to claim 1 wherein said acoustically transparent transducer material layer comprises an electrostrictive polyurethane.

5. The volumetric transducer array according to claim 4 wherein said acoustically transparent transducer material layer is selected from the group consisting of polyvinylidene diflouroethylene and polyvinylidene trifluoroethylene.

6. The volumetric transducer array according claim 1 further comprising a plurality of layers of electrically non-conductive bonding material, each of said layers of bonding material being intermediate a pair of adjacent acoustically transparent transducer material layers.

7. The volumetric transducer array according to claim 6 wherein said bonding material comprises an electrically non-conductive epoxy.

8. The volumetric transducer array according to claim 1 wherein one of said pair of circuit support layers is positioned on said first side of a topmost one of said plurality of layers of acoustically transparent transducer material.

9. The volumetric transducer array according to claim 8 wherein the other of said pair of circuit support layers is positioned on said second side of a bottommost one of said plurality of layers of acoustically transparent transducer material.

10. The volumetric transducer array according to claim 1 wherein each of said circuit support layers has a contact side facing the corresponding contact surface and an insulating side positioned away from the corresponding contact surface, said contact side having electrically conductive regions thereon in electrical contact with the appropriate contact surface of each said transducer column.

11. The volumetric transducer array according to claim 10 wherein each of said circuit support layers further comprises a plurality of electrically conductive terminal members, each of said terminal members being electrically connected to a corresponding one of said electrically conductive regions.

12. The volumetric transducer array according to claim 1 further comprising a plurality of layers of said transducer elements and a plurality of pairs of circuit support layers arranged in a laminated configuration and in an alternating fashion such that each layer of transducer elements is between one said pair of circuit support layers.

13. The volumetric transducer array according to claim 1 wherein said layer of transducer elements and said at least one pair of circuit support layers are configured in a generally planar geometry.

14. The volumetric transducer array according to claim 1 wherein said layer of transducer elements and said at least one pair of circuit support layers are configured in a generally cylindrical geometry.

15. The volumetric transducer array according claim 1 further comprising a plurality of layers of bonding material, each layer of bonding material being between one of said circuit support layers and a corresponding said exposed surface of said transducer element, the bonding material being configured to be electrically conductive only in the direction that is perpendicular to the layer of bonding material.

16. The volumetric transducer array according claim 1 further comprising stiffening members attached to each of said circuit support layers to provide structural rigidity.

17. A transducer element comprising:

at least one acoustically transparent transducer material layer having a first side and a second side opposite said first side;

a plurality of first side electrically conductive portions mounted on said first side of each said material layer such that each first side electrically conductive portion is electrically isolated from other first side electrically conductive portions, and said first side electrically conductive portions having a first polarity;

a plurality of second side electrically conductive portions mounted on said second side of each material layer such that each second side electrically conductive portion is substantially aligned with a corresponding one of said first side electrically conductive portions, each second side being electrically isolated from other second side electrically conductive portions, and said second side electrically conductive portions having a second polarity opposite said first polarity;

said plurality of first side electrically conductive portions being arranged on said layers of acoustically transparent transducer material such that each shares a two-dimensional position with corresponding first side electrically conductive portions on other acoustically transparent transducer material layers, all of said first side electrically conductive portions at a corresponding position being electrically joined together; and said plurality of second side electrically conductive portions being arranged on said layers of acoustically transparent transducer material such that each shares a two-dimensional position with corresponding second side electrically conductive portions an other acoustically transparent transducer material layers, all of said second side electrically conductive portions at a corresponding position being electrically joined together.

18. A transducer element for a sonar array, comprising a plurality of layers of acoustically transparent transducer material in a laminated configuration, one of said layers forming one end layer of the laminated configuration and another of said layers forming an opposite end layer of the laminated configuration, each of said layers having a first side and a second side opposite the first side, said first side having a plurality of electrically conductive portions that are electrically isolated from each other, arranged in a two-dimensional arrangement such that each conductive portion has a particular two-dimensional location, and configured to have one polarization, said second side having a plurality of electrically conductive portions that are electrically isolated from each other and said conductive portions on said first side, arranged in a two-dimensional arrangement that is the same as said two-dimensional arrangement in which said conductive portions of said first side are arranged such that each said conductive portion of said second side shares a two-dimensional location with a corresponding said conductive portion of said first side, and configured to have another polarization that is opposite said one polarization, said layers being arranged so that opposite polarizations do not contact each other, said electrically conductive portions of said first sides that share the same two-dimensional location being electrically connected together and said electrically conductive portions of said second sides that share the same two-dimensional location being electrically connected together.

19. The transducer element according to claim 18 wherein said layers forming the end layers of the laminated configuration having sides thereof that are exposed, the polarity of one of said exposed sides being different than the other of said exposed sides.

* * * * *